United States Patent [19]

Yokokawa et al.

[11] 4,321,537
[45] Mar. 23, 1982

[54] FOURIER TRANSFORM NUCLEAR MAGNETIC RESONANCE SPECTROMETER

[75] Inventors: Hiroshi Yokokawa, Katsuta; Chutetsu Hattori, Mito; Masaaki Takeda, Katsuta, all of Japan

[73] Assignee: Hitachi, Ltd., Tokyo, Japan

[21] Appl. No.: 58,430

[22] Filed: Jul. 18, 1979

[30] Foreign Application Priority Data

Jul. 21, 1978 [JP] Japan .................................. 53-88451

[51] Int. Cl.$^3$ ............................................. G01N 27/00
[52] U.S. Cl. ..................................... 324/312; 324/307
[58] Field of Search ................ 324/307, 312, 314, 311

[56] References Cited

U.S. PATENT DOCUMENTS

| | | | |
|---|---|---|---|
| 3,475,680 | 10/1969 | Anderson et al. | |
| 3,810,001 | 5/1974 | Ernst | 324/314 |
| 3,873,909 | 3/1975 | Ernst | 324/312 |
| 4,065,714 | 12/1977 | Hill | 324/312 |

*Primary Examiner*—Michael J. Tokar
*Attorney, Agent, or Firm*—Craig and Antonelli

[57] ABSTRACT

In a Fourier transform nuclear magnetic resonance spectrometer, as is known, a pulse modulated radio frequency is applied to a sample placed in a magnetic field, and a free induction decay signal resulting from the above application is Fourier transformed to obtain a nuclear magnetic resonance spectrum. In such a spectrometer, a material having a predetermined resonance peak, for example, tetramethylsilane is used as a reference sample, and the center frequency of the pulse modulated radio frequency is successively varied while maintaining a constant magnetic field intensity. The position of peak of tetramethylsilane in frequency spectra thus obtained is varied with the change of the center frequency. By measuring successively the signal strength of the peak, there can be obtained a frequency characteristic of a receiving system employed in the spectrometer, which is used to obtain correction coefficients of the receiving system. By multiplying a frequency spectrum of a sample to be analyzed by the correction coefficients, the frequency characteristic of the receiving system is corrected, and thus the signal strength of the frequency spectrum can be indicated with high accuracy.

5 Claims, 7 Drawing Figures

FOURIER TRANSFORM NUCLEAR MAGNETIC RESONANCE SPECTROMETER

BACKGROUND OF THE INVENTION

1. Field of the Invention

The present invention relates to a nuclear magnetic resonance spectrometer, and more particularly to a Fourier transform nuclear magnetic resonance spectrometer (hereinafter referred to as an FT-NMR spectrometer) in which a high frequency pulse is applied to a sample placed in a magnetic field, and a free induction decay signal (hereinafter referred to as an FID signal) of a nuclear spin resulting from the application of the high frequency pulse is Fourier-transformed to obtain a frequency spectrum.

2. Description of the Prior Art

Although atomic nuclei of hydrogen ($^1H$), carbon ($^{13}C$), fluorine ($^{19}F$), or the like can be measured with the nuclear magnetic resonance spectrometer, the conventional FT-NMR spectrometer has been used mainly to measure $^{13}C$. Since $^{13}C$ is about 1% in natural abundance ratio and is contained in a sample in a very small quantity as compared with hydrogen or the like, a resonance signal of $^{13}C$ detected by a nuclear magnetic resonance spectrometer is very weak. Accordingly, as is disclosed in U.S. Pat. No. 3,475,680, signal detection is conducted scores of times in a short time with the FT-NMR spectrometer, and the detected signals are added to improve the signal-to-noise ratio. With respect to $^{13}C$, however, there is utilized the chemical shift appearing in a frequency spectrum.

A regards $^1H$, both the chemical shift and the signal strength in the frequency spectrum have been measured recently to effect the structural analysis of low molecular weight materials. Thus, it is required to measure the strength of the signal with a high accuracy. Although $^1H$ can be measured with a general frequency-sweep or field-sweep nuclear magnetic resonance spectrometer because of its signal strength greater than that of $^{13}C$, the measurement of $^1H$ with the FT-NMR spectrometer is effective in that the measuring time can be shortened, or when a sample of a very small-amount which is extracted in synthesizing a compound or the like, has to be dealt with. However, the conventional FT-NMR spectrometer has a drawback that the signal strength cannot be measured with high accuracy for atomic nuclei, for example, $^1H$ which requires a highly accurate measurement of signal strength.

SUMMARY OF THE INVENTION

The inventors have studied in detail the measurement of $^1H$ conducted with the FT-NMR spectrometer, and found that the above-mentioned drawback is based upon the following facts. In the conventional FT-NMR spectrometer, the receiving system (including in general a radio frequency amplifier, a frequency mixer, an audio frequency amplifier, a radio frequency band pass filter, an audio frequency band pass filter, and the like) which receives a high frequency pulse having been applied to a sample, has such a frequency characteristic as greatly attenuating out-band signals and moreover exhibiting steep attenuation slopes, in order to enhance the signal-to-noise ratio. In the case where an active filter or a crystal filter is employed, however, it is very hard to reduce the ripple within the pass band to several %. By way of example, in the case where a high frequency of 60 MHz is employed for the measurement of $^1H$, a spectrum measuring range of 10 ppm corresponds to 600 Hz, and a ripple of several % is present in this frequency band. Though the above-mentioned ripple is a kind of frequency characteristic with respect to amplitude, the filter has further such a frequency characteristic with respect to phase that the phase is varied nonlinearly with frequency. Owing to the above-mentioned frequency characteristics of amplitude and phase, the conventional receiving system cannot provide the signal strength having a satisfactory accuracy. The present invention has been made based upon the inventors' knowledge that the drawback of the conventional FT-NMR spectrometer arises as a result of the frequency characteristic of the receiving system.

An object of the present invention is to provide an FT-NMR spectrometer in which the strength of signals can be measured with high accuracy.

In order to attain the above and other objects, according to the present invention, the frequency characteristic of the receiving system of an FT-NMR spectrometer is measured, to correct that frequency characteristic of the receiving system which is involved in the spectrum of a sample.

DESCRIPTION OF THE PREFERRED EMBODIMENTS

Figure 1:
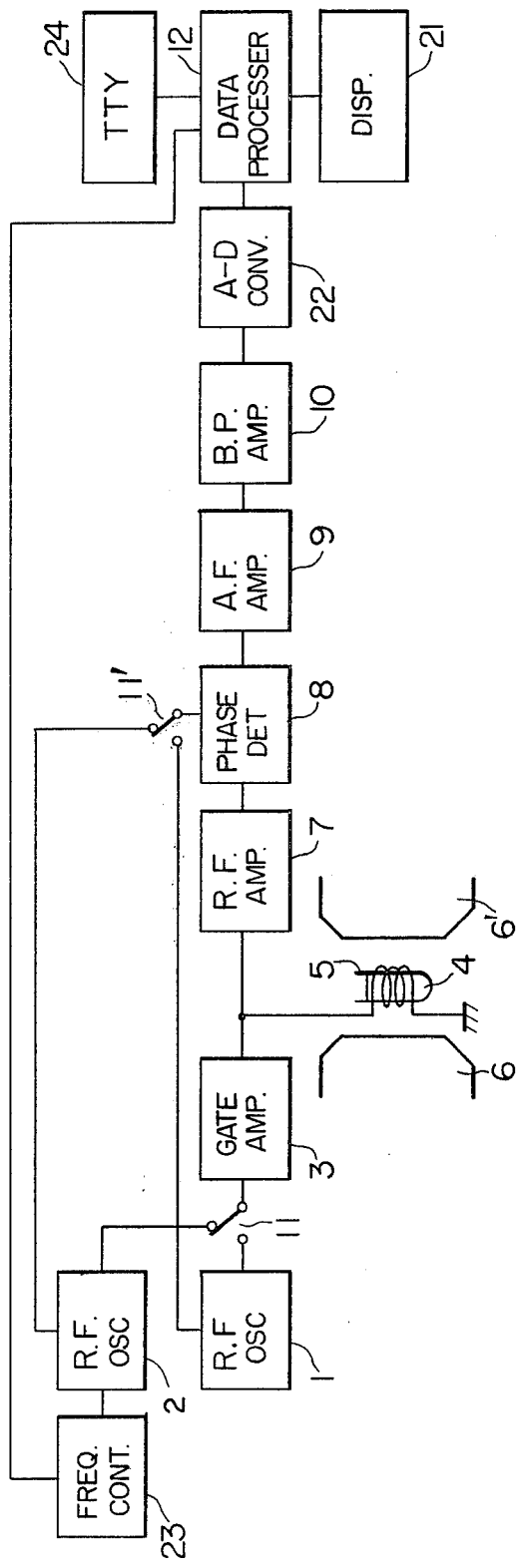
FIG. 1 is a block diagram showing an embodiment of an FT-NMR spectrometer according to the present invention.
Figure 2:
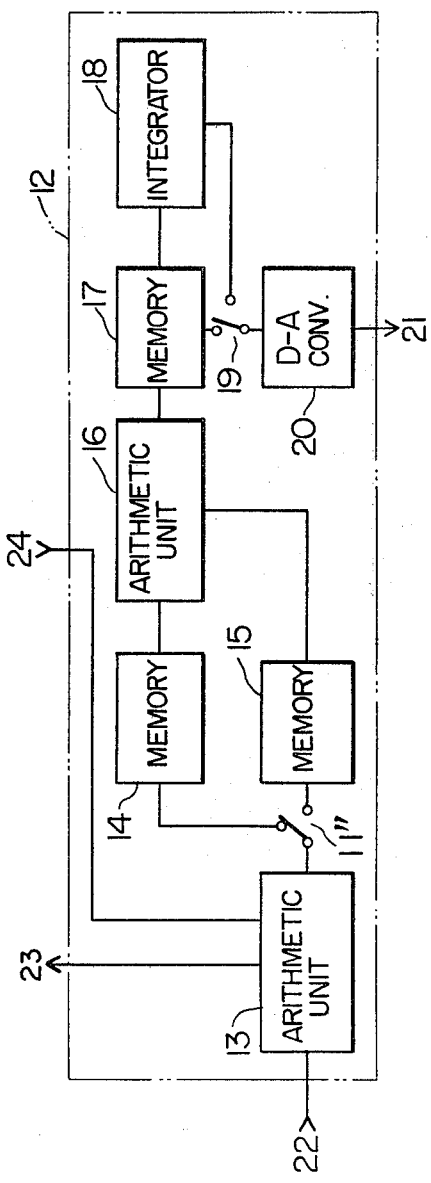
FIG. 2 is a block diagram for showing in detail a part of the embodiment shown in FIG. 1.

Now, an embodiment of an FT-NMR spectrometer according to the present invention will be explained below with reference to FIG. 1. Since the embodiment differs from the conventional FT-NMR spectrometer in that the former includes a variable radio frequency oscillator 2, a change-over switch 11, 11' and a frequency controller 23, and in the circuit construction of a data processor 12, the conventional FT-NMR spectrometer is first explained. Referring to FIG. 1, a radio frequency delivered from a radio frequency oscillator 1 is pulse modulated by a gate amplifier 3. A coil 5 is arranged around a sample 4, which is placed in a magnetic field formed between a pair pole pieces 6 and 6' of a magnet. The pulse-modulated radio frequency is applied through the coil 5 to the sample 4. During a period when the radio frequency pulse applied to the sample 4 is put in the off-state, an FID signal is sent out of the sample 4 through the coil 5. The FID signal thus obtained is amplified by a radio frequency amplifier 7, and then detected as an audio signal by a phase detector 8 which operates in synchronism with the radio frequency supplied from the radio frequency oscillator 1. Incidentally, the FID signal may be converted into an audio frequency signal through an intermediate frequency signal. The audio frequency signal is amplified by an audio frequency amplifier 9, and then sent to a band pass amplifier 10. An output signal from the band pass amplifier 10 is converted by an analog-digital converter 22 into a digital signal to be read in to a data processor 12. In the data processor 12, the FID signal which has been converted into the digital signal, is Fourier transformed. Thus, a frequency spectrum is obtained to be indicated by a display device 21. The band pass amplifier 10 such as a crystal filter can remove the undesired fold-over of noise, and thus improves the S/N ratio. In the foregoing, there have been described the construction and function of the conventional FT-NMR spectrometer. Next, explanation will be made on a method of forming a correction spectrum which is used to correct the frequency characteristic of the receiving system. The switch 11 is changed-over so as to connect the variable radio frequency oscillator 2 and the gate amplifier 3. When the frequency of the radio frequency oscillator 1 is equal to 60 MHz, the frequency of the variable radio frequency oscillator 2 is made variable in a frequency range of, for example, 600 to 1200 Hz (corresponding to a proton resonance signal generating frequency range) in the neighborhood of 60 MHz. Further, the oscillator 2 generates oscillations of a constant amplitude in the above frequency range. The frequency controller 23 specifies the frequency generated by the variable radio frequency oscillator 2 on the basis of an instruction supplied from the data processor 12. The radio frequency of a specified frequency is pulse modulated by the gate amplifier 3 to be applied to the sample 4 through the coil 5. In this case, as the sample 4 is employed a reference sample such as tetramethylsilane, benzene, or water, which has one or more spectral lines at known resonance frequencies. The FID signal produced by the reference sample 4 is applied to and read in the data processor 12 through the radio frequency amplifier 7, phase detector 8, audio frequency amplifier 9 and band pass amplifier 10. Referring to FIG. 2, the FID signal is Fourier transformed by an arithmetic unit 13 included in the data processor 12, and a peak value (or an amplitude) of the predetermined spectral line of the reference sample is read. When the read value expressed by $h(f_1)$, and when a value obtained by subtracting a constant value $h_o$ from $h(f_1)$ is expressed by $\Delta h_o(f_1)$, a correction coefficient $h(f_1)/h_o$ is given by the following equation:

$$\frac{h(f_1)}{h_o} = 1 + \frac{\Delta h_o(f_1)}{h_o}$$

Figure 3A:
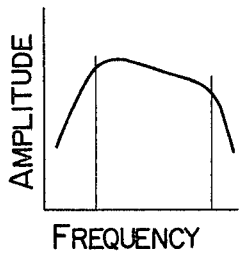
FIGS. 3A to 3C are graphs for explaining frequency characteristics.
Figure 3B:
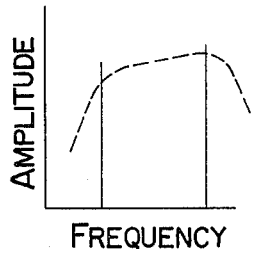
Figure 3C:
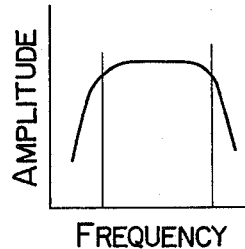

The correction coefficient is stored in a reference spectrum memory 14. Subsequently, the oscillation frequency of the variable radio frequency oscillator 2 is successively varied, and the peak value of the predetermined spectral line of the reference sample is successively read. Thus, a multiplicity of correction coefficients $h(f_1)/h_o$ are obtained, and stored in the memory 14. In FIGS. 3A to 3C showing frequency characteristics, the abscissa indicates a frequency, and the ordinate an amplitude. Since the output of the variable radio frequency oscillator 2 is constant independent of frequency, a spectrum of $h(f)$ shown in FIG. 3A should have a constant amplitude within a specified frequency range. However, the spectrum is not constant in amplitude, as shown in FIG. 3A, due to the frequency characteristic of the amplitude in the receiving system. To solve this problem, in the memory 14 there is stored a correction spectrum $h(f)/h_o$ as shown in FIG. 3B, which is used for correction. Thus, there can be obtained a flat frequency characteristic as shown in FIG. 3C.

Next, explanation will be made on the correction of the frequency characteristic. After the correction spectrum has been stored in the reference spectrum memory 14, the switch 11 is changed over to connect the radio frequency oscillator 1 and the gate amplifier 3, and a sample under investigation is used in place of the reference sample. Subsequently, the measurement on the sample under investigation is conducted through the conventional Fourier transform nuclear magnetic resonance method. A detected FID signal is read in the data processor 12, and Fourier-transformed by the arithmetic unit 13. The measured spectrum data thus obtained is stored in a measured spectrum memory 15. The data stored in the reference spectrum memory 14 and the data stored in the measured spectrum memory 15 are read out in such a manner that a pair of data of the same frequency are simultaneously taken out to correct the frequency characteristic of the measured spectrum by an arithmetic unit 16. In more detail, if the data prior to the correction of frequency characteristic which is stored in the measured spectrum memory 15, is expressed by $F'(f)$, the exact spectrum or corrected spectrum $F(f)$ is given by the following equation:

$$F(f) = F'(f) \times \frac{h(f)}{h_o} = F'(f) \times \left(1 + \frac{\Delta h_o(f)}{h_o}\right)$$

Incidentally, in a case where data of the reference spectrum is small in number, the above correction is made through interpolation. The exact spectrum $F(f)$ obtained as above is stored in a result memory 17. The spectrum or data $F(f)$ stored in the memory 17 is indicated by the display device 21 through a digital-analog converter 20. In the case where an integrated output is desired, an integrator 18 is used through the changeover of a switch 19.

In the foregoing, there has been explained the correction of a frequency characteristic with respect to amplitude. However, the correction with respect to phase can also be made in the following manner. That is, a correction spectrum with respect to phase is formed in the arithmetic unit 13, and then stored in the memory 14. The frequency characteristic with respect to phase can be corrected in the arithmetic unit 16 by employing the stored correction spectrum. In order to conduct the correction of both amplitude and phase, it is necessary to include the reference spectrum memory 14 in duplicate, to form both the correction spectrum with respect to amplitude and that with respect to phase in the arithmetic unit 13, and to conduct the correction of amplitude and phase in the arithmetic unit 16. In the foregoing explanation, the measured spectrum memory 15 and the result memory 17 are separately provided. However, it is possible to have only a single memory for common use. Further, it is possible to replace the arithmetic units 13 and 16 and the integrator 18 by a central processing unit of a digital computer, and to replace the memories 14, 15 and 17 by a memory device of the computer.

According to the embodiment of the present invention, since it is possible to correct the frequency characteristic with respect to amplitude of the receiving system, the accuracy of measurement is greatly enhanced. Further, since the frequency characteristic with respect to phase has hitherto been corrected linearly in a frequency range, errors have been produced between the corrected characteristic and an actual nonlinear characteristic. According to the present embodiment, a correction spectrum with respect to phase is employed, and therefore the accuracy of measurement is remarkably improved. As described above, the embodiment of the present invention enhances the accuracy of measurement, and thus enables the structural analysis of low molecular weight materials.

Next, the variable radio frequency oscillator 2 and the frequency controller 23 are explained in detail with reference to FIG. 4. The oscillator 2 includes a radio frequency oscillator 38 having an oscillation frequency of 55.2 MHz and a radio frequency oscillator 39 having an oscillation frequency of 4.8 MHz. A quartz vibrator 31, a variable capacitance diode 32 and a transistor made up a voltage-controlled oscillator (or a VCO). The reference oscillation frequency of the VCO is equal to 9.2 MHz. The frequency of the signal from the VCO is increased sixfold by a frequency multiplier circuit 33. The output signal of 55.2 MHz from the frequency multiplier circuit 33 is mixed with the output signal of 4.8 MHz from the radio frequency oscillator 39 by a frequency mixer 40 to form an output signal of 60 MHz. On the other hand, a frequency mixer 34 is applied with the output signal from the frequency multiplier circuit 33 and the output signal from the radio frequency oscillator 38 to deliver an output signal having a frequency f equal to the difference between respective frequencies of applied signals. A transistor 35 which serves as a frequency-current converter (F-I converter), is switched in accordance with the above difference frequency f. Thus, charges on a capacitor 36 are sent out at a period of f, and a current $i_4$ proportional f is produced as follows:

$$i_4 = f - CV_c$$

The input current of an operational amplifier 37 is put in equilibrium in accordance with the following relation:

$$i_4 = i_1 + i_2 + i_3 = \left(\frac{V_1}{R_1}\right) + \left(-\frac{V_2}{R_2}\right) + \left(-\frac{V_c}{R_3}\right),$$

where $V_1$ indicates a voltage applied through a digital-analog converter 41 from the data processor 12, and $V_2$ a divided voltage of $V_c$ by a variable resistor $R_4$.

When $V_1$ and $V_2$ are both equal to zero, the variable radio frequency oscillator 2 delivers the output of 60 MHz. When $V_1$ is changed to a predetermined value, $i_4$ becomes as follows:

$$i_4 = \frac{V_1}{R_1} - \frac{V_c}{R_3}$$

Thus, the oscillation frequency of the voltage-controlled oscillator is varied, and that of the oscillator 2 is also varied. Since that difference frequency from the mixer 34 which follows the above change in oscillation frequency, is fed back through the F-I converter, a control loop is kept in equilibrium.

Figure 4:
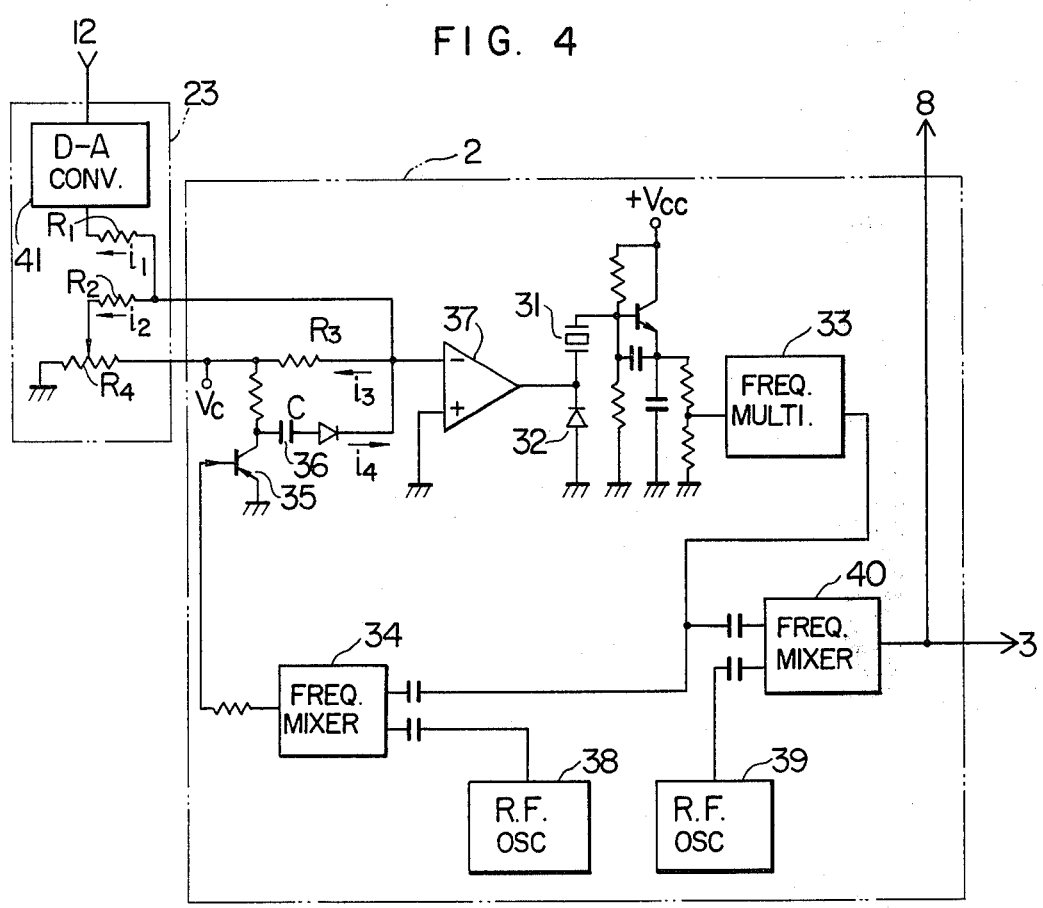
FIG. 4 is a circuit diagram for showing in detail a radio frequency oscillator employed in the present invention.

Although the radio frequency oscillators 1 and 2 are employed in the circuit arrangement shown in FIG. 1, it is possible to have only a single oscillator for common use because the oscillator 2 shown in FIG. 4 can also serve as the oscillator 1 when the voltages $V_1$ and $V_2$ resulting from the frequency controller 23 are both made equal to zero.

Now, one of modifications of the present invention is explained. In the above-mentioned embodiment, the frequency of the variable radio frequency oscillator 2 is successively varied to obtain the correction spectrum. However, in the case where the correction spectrum can be approximated by a quadratic function, the frequency of the oscillator 2 is varied at intervals to obtain three constants a, b and c of the quadratic function. When data stored in the measured spectrum memory is expressed by $f_n$, the exact or corrected data $f'_n$ is given by the following equation.

$$f'_n = af_n^2 + bf_n + c$$

The oscillation frequency of the oscillator 2 may be varied based upon the instruction from the data processor 12, as has been explained in connection with FIG. 1. However, since only a few oscillation frequencies are employed as representative ones in the quadratic approximation, the oscillation frequency may be varied by manually changing over a variable resistor $R_4$ included in the frequency controller 23, and by inputting respective resistance values through a teletypewriter (TTY) 24.

Further, the accuracy of correction can be enhanced by employing a function of higher order which is obtainable by increasing the number of oscillation frequencies. According to this modification, the correction can be readily conducted, and the FT-NMR spectrometer is operated with high efficiency.

Figure 5:
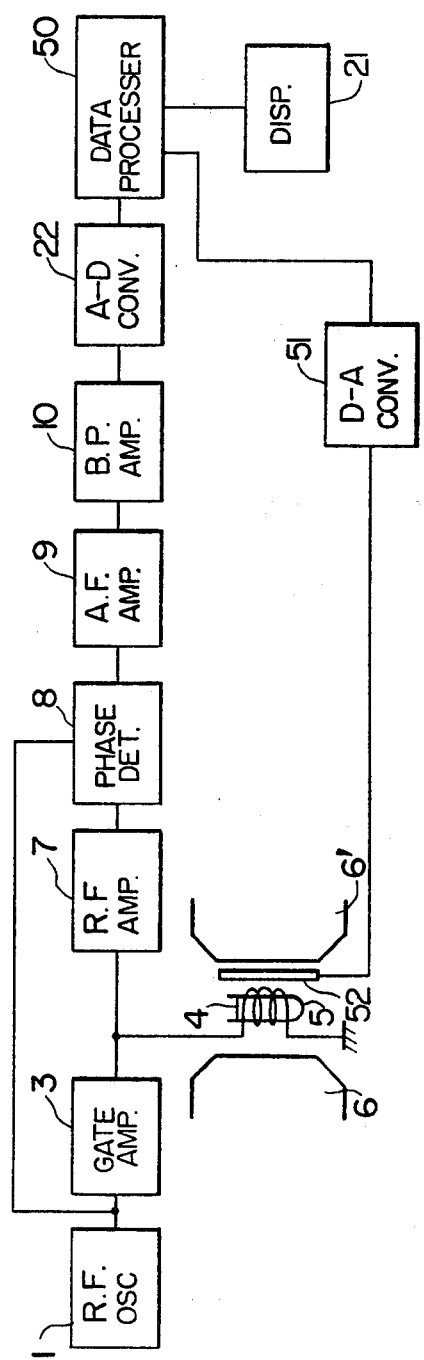
FIG. 5 is a block diagram showing another embodiment of an FT-NMR spectrometer according to the present invention.

Next, another embodiment of the present invention will be explained with reference to FIG. 5. In FIG. 5, the same reference numerals as in FIG. 1 indicate like parts. The embodiments shown in FIGS. 1 and 5 are fundamentally different from each other in the method for forming the correction spectrum. That is, in the embodiment shown in FIG. 1, a frequency sweep method in a sense is employed to obtain the correction spectrum. On the other hand, a magnetic field sweep method is used in the embodiment shown in FIG. 5. Now, explanation will be made on the method of forming the correction spectrum according to the latter embodiment. Referring to FIG. 5, a sample 4 is applied with an auxiliary magnetic field formed by a field shifting coil 52, together with a magnetic field established by a magnet having a pair of pole pieces 6 and 6'. The intensity of the auxiliary magnetic field is varied by an instruction supplied through a digital-analog converter 51 from a data processor 50. The detailed illustration of the data processor 50 is omitted because of its circuit arrangement similar to that of the data processor 12 shown in FIG. 2. In forming a correction spectrum, the previously-mentioned reference sample is employed as the sample 4. A radio frequency oscillation delivered from a radio frequency oscillator 1 is pulse-modulated by a gate amplifier 3, and then is applied to the sample 4 through a coil 5. An FID signal sent out of the sample 4 is supplied through a radio frequency amplifier 7, phase detector 8, audio frequency amplifier 9 and band pass amplifier 10 to the data processor 50 to be read therein in the form of an audio frequency FID signal. At this time, the auxiliary magnetic field formed by the field shifting coil 52 has a constant field intensity. The FID signal read in the data processor 50 is Fourier transformed to obtain a spectrum of the reference sample, the peak value or amplitude of which is measured to calculate a correction coefficient $h(f_1)/h_o$ as mentioned previously. The correction coefficient thus obtained is stored in a reference spectrum memory. Subsequently, the intensity of the auxiliary magnetic field is successively varied based upon instructions from the data processor 50. Thus, peak values of respective spectra of the reference sample are successively measured to calculate and store correction coefficients $h(f_i)$. That is, a correction spectrum is stored in the reference spectrum memory. Then, the reference sample is replaced by a sample under investigation, and the measurement on the sample is conducted in the conventional Fourier transform nuclear magnetic resonance method. The FID signal thus produced is Fourier transformed to be stored in a measured spectrum memory. The correction spectrum stored in the reference spectrum memory and the measured spectrum stored in the measured spectrum memory are successively read out in such a manner that respective components of the same frequency are simultaneously taken out, in order to correct the frequency characteristic in an arithmetic unit. The output of the arithmetic unit is stored in a result memory, and then converted by a digital-analog converter into an analog signal to be indicated by a display device 21.

In the foregoing explanation, correction has been made on the frequency characteristic of amplitude. Similarly, the frequency characteristic of phase can also be corrected. Further, a digital computer may be used in place of the data processor 50. Additionally, it is possible to approximate the correction spectrum by a function of higher order having those constants which have been determined by changing the intensity of the auxiliary magnetic field at intervals, and to correct the measured spectrum with the function of higher order thus obtained. According to the embodiment shown in FIG. 5, the frequency characteristic with respect to amplitude or phase of the receiving system can be corrected, and therefore the accuracy in measurement and integration is greatly enhanced.

As has been explained hereinbefore, according to the present invention, both the frequency characteristic of amplitude and that of phase can be corrected. However, it is not always required to conduct both corrections, but even either one of both corrections can exhibit a remarkable effect. Further, the measurement with the present invention is not limited to hydrogen, but the present invention is applicable to various kinds of nuclear for which highly accurate measurements of both the chemical shift and the signal strength are required.

We claim:

1. A Fourier transform nuclear magnetic resonance spectrometer comprising:

means for applying a pulse-modulated radio frequency to a sample placed in a magnetic field;

receiving means for detecting a free induction decay signal sent out of said sample through the application of said pulse-modulated radio frequency to produce an audio-frequency free induction decay signal;

arithmetic means for conducting a Fourier transformation on said audio-frequency free induction decay signal delivered from said receiving means to produce a frequency spectrum;

means for detecting a frequency characteristic in a passband of said receiving means to produce a correction coefficient; and means for arithmetically correcting said frequency spectrum of said sample by the use of said correction coefficient, said frequency spectrum being affected by said frequency characteristic of said receiving means.

2. A Fourier transform nuclear magnetic resonance spectrometer according to claim 1, wherein said means for producing said correction coefficient comprises means for successively changing a relative value with respect to both the intensity of said magnetic field and the center frequency of said pulse-modulated radio frequency applied to a reference sample having a predetermined peak, means for detecting a change in value of said peak of said reference sample resulting from said change of said relative value, and means for producing said correction coefficient at each frequency on the basis of said change of said peak value.

3. A Fourier transform nuclear magnetic resonance spectrometer according to claim 1, wherein said means for producing said correction coefficient comprises means for changing a relative value with respect to both the intensity of said magnetic field and the center frequency of said pulse-modulated radio frequency oscillation applied to a reference sample having a predetermined peak at a plurality of intervals, means for detecting a change in value of said peak of said reference sample resulting from said change of said relative value, and means for approximating a correction spectrum by a function on the basis of a plurality of values of said peak to employ each of constants included in said function as said correction coefficient.

4. A Fourier transform nuclear magnetic resonance spectrometer according to claim 2 or 3, wherein said means for changing said relative value includes a variable radio frequency oscillator and means for controlling the oscillation frequency thereof.

5. A Fourier transform nuclear magnetic resonance spectrometer according to claim 2 or 3, wherein said means for changing said relative value includes a magnetic field shifting coil for changing the intensity of said magnetic field and means for controlling an electric current flowing through said coil.

* * * * *